United States Patent

Englisch et al.

[11] Patent Number: 5,831,309
[45] Date of Patent: Nov. 3, 1998

[54] SEMICONDUCTOR ELEMENT FOR AN ELECTRONIC OR OPTO-ELECTRONIC SEMICONDUCTOR COMPONENT

[75] Inventors: Wolfgang Englisch, Kelkheim; Reinhold Uebbing, Alzenau, both of Germany

[73] Assignee: Heraeus Quarzglas GmbH, Hanau, Germany

[21] Appl. No.: 737,778

[22] PCT Filed: Jun. 2, 1995

[86] PCT No.: PCT/EP95/02095

§ 371 Date: Nov. 25, 1996

§ 102(e) Date: Nov. 25, 1996

[87] PCT Pub. No.: WO95/34091

PCT Pub. Date: Dec. 14, 1995

[30] Foreign Application Priority Data

Jun. 9, 1994 [DE] Germany .......................... 44 20 024.2

[51] Int. Cl.[6] ...................................................... H01L 29/00
[52] U.S. Cl. .......................... 257/347; 257/460; 257/507; 257/629; 257/707; 438/455; 438/974; 228/116; 228/903; 156/281
[58] Field of Search .................................... 257/347, 460, 257/507, 629, 707; 228/116, 903; 156/281; 438/974, 455

[56] References Cited

U.S. PATENT DOCUMENTS 4,883,215  11/1989  Goesele et al. .......................... 228/116
4,962,879  10/1990  Goesele et al. .......................... 228/116
5,266,824  11/1993  Abe et al. ................................ 257/347
5,409,770   4/1995  Netsu et al. .......................... 428/310.5
5,543,648   8/1996  Miyawaki ................................ 257/347
5,571,373  11/1996  Krishna et al. ....................... 156/636.1

FOREIGN PATENT DOCUMENTS 0504714  9/1992  European Pat. Off. .

*Primary Examiner*—William Mintel
*Attorney, Agent, or Firm*—Felfe & Lynch

[57] ABSTRACT

Semifinished products designed as composite bodies for electronic or opto-electronic semiconductor components are known. The composite bodies are made of a disk-shaped, transparent quartz glass substrate and a wafer made of a semiconductor material. The directly bonded surfaces of the quartz glass substrate and wafer are polished before being mutually bonded. In order to create a semifinished product that resists temperatures above 900° C., such as those used to produce semiconductor circuits in industrially feasible times, without raising fears of a substantial reduction of the adhesive forces, chipping of the wafers away from each other or an undesirable deformation of the composite body, the substrate quartz glass is a synthetic quartz glass with at least $10^{14.0}$ poise viscosity at 950° C. which does not fall below $10^{12}$ poise at 1050° C. The synthetic quartz glass contains maximum 1 ppm alkali elements and maximum 1 ppm metallic impurities of the elements iron, nickel, copper, chromium and/or transition metals. At least one of the polished surfaces has a roughness depth $R_q$ not higher than 2 nm.

15 Claims, 1 Drawing Sheet

SEMICONDUCTOR ELEMENT FOR AN ELECTRONIC OR OPTO-ELECTRONIC SEMICONDUCTOR COMPONENT

BACKGROUND OF THE INVENTION

The invention relates to a semiconductor element in the form of a sandwich for an electronic or opto-electronic semiconductor component, wherein the sandwich consists of a transparent flat quartz glass substrate and a wafer of a semiconductor material, and wherein the surfaces of the quartz glass substrate and the wafer, joined directly together face-to-face, were polished before they were joined together.

Semiconductor elements of this kind are disclosed in EP-0 504 714 A2 and U.S. Pat. No. 4,883,215, it being stated in the latter patent that the joined surfaces are mirror-polished before bonding, while in the cited European patent application the term "polished" is used. The wafers are placed together with the polished surfaces face-to-face, and joined together by pressing. Afterward the thickness of the wafer of semiconductor material can be reduced in steps by chemical or mechanical treatment. As can be learned from EP-0 504 714 A2, the bond between the wafers is created by treatment at various temperature steps from a temporary bond (110° C. to 350° C.) to a full bond (250° C. to 500° C.), the thickness of the wafer of semiconductor material being reduced after each intermediate temperature step.

The known bonded semiconductor elements, however, cannot satisfy the requirements of semiconductor technology, for as it is known from EP-0 504 714 A2, an extreme reduction of the forces in adhesion between the wafers occurs if the laminate is exposed, for example, to a temperature of only 700° C. for two hours. Therefore an at least partial separation of the wafers from one another as well as a destructive distortion of the sandwich cannot be avoided.

SUMMARY OF THE INVENTION

The invention is addressed to the problem of preparing semiconductor elements in sandwich from which can withstand temperatures as high as 900° C., such as those employed in the manufacture of semiconductor circuits, for an economically realistic time period, without fear that a substantial reduction of the forces of adhesion a separation of the wafers from one another, or any undesirable distortion of the laminated body will occur.

According to the invention semiconductor element the quartz glass of the substrate is a synthetic quartz glass which has a viscosity of $10^{14.0}$ poise at 950° C., and which does not fall below a level of $10^{12}$ poise at a temperature of 1050° C. The total content of alkali elements in the quartz glass is no more than 1 ppm, and the quartz glass contains a total of no more than 1 ppm of metallic impurities of the elements nickel, copper, chromium and/or transition metals. At least one of the polished surfaces has a roughness depth $R_q$ of no more than 2 nm. The roughness depth $R_q$ is understood to mean the square of the average measured profile depth within a unit measured length. Preferably the roughness depth $R_q$ of the polished surfaces is less than 1 nm. It has proven particlarly advantageous to use for the laminate a quartz glass substrate whose polished surface has a roughness depth $R_q$ of no more than 0.5 nm.

In the semiconduct elements according to the invention, even after a heat treatment of two hours at 950° C., no substantial deformation, especially sagging or distortion, could be observed. This is probably can be attributed to the fact that the selected quartz glass for the mechanically stabilizing part of the laminate, on account of its high viscosity, withstands high temperature stresses, such as those involved, for example, in the preparation of an insulating oxide in a silicon layer, without substantial mechanical deformation. Neither could any loosening of the quartz glass substrate from the wafer of semiconducting material be observed. The excellent strength of adhesion of the laminate is assured by the fact that the polished surfaces of the quartz glass substrate and of the semiconducting material which are to be joined face-to-face are polished such that at least one of them has a roughness depth $R_q$ of no more than 2 nm. A decided improvement of the strength of adherence results when the roughness depth $R_q$ of the polished surface of the quartz glass substrate amounts to no more than 0.5 nm.

The low content of alkali elements assures that the semiconducting properties of the semiconductor material will not be negatively affected by the diffusion of such elements into the quartz glass that is employed.

The purity of the quartz glass i.e., having no more than one ppm of alkali elements and no more than 1 ppm of iron, nickel, copper, chromium and/or the transition metals, and optionally no more than one ppm of phosphorous, arsenic, antimony, bismuth, boron, gallium, indium and/or titanium, assures that in the further processing of the semiproduct to electronic semiconductor components, such as semiconductor memories (RAMs, DRAMs), microprocessors or transistors, (if the wafer of the semiconducting material consists of doped silicon,) or to opto-electronic components (such as, for example, TAFT-LCD's (thin film transistor liquid crystal displays), if the wafer of semiconductor material consists of doped silicon,) no substances undesirably affecting the electronic properties of the semiconductor material can enter the doped silicon by diffusion, for example. Instead of wafers of doped silicon as semiconductive material, wafers of doped gallium arsenide, gallium phosphide, gallium aluminum arsenide or gallium nitride may also be used in the production also of opto-electronic components from semiconductor elements according to the invention.

The thickness of the quartz glass substrate advantageously is to less than 10 mm; preferably it is less than 2 mm.

For the further manufacture of the semiconductor element according to the invention into electronic or opto-electronic semiconductor components it has been found advantageous in the finished sandwich to reduce the wafer of semiconductor material by ablation, preferably to a thickness of no more than 5000 nm. Thus the semiconductive part of the sandwich is reduced to an optimum thickness. Subsequent doping can be present in the entire surface through the entire thickness of the semiconducting material or also in discrete areas. The silicon dioxide content of the semiconductor element with a reduced thickness of no more than 5000 nm of the semiconducting material amounts to at least 99.2%. Suitable mechanical methods for reducing the thickness of the semiconductive material are known in semiconductor technology. If the thickness of the semiconductive material is to be very thin, for example, where a thickness of less than 200 nm is to be removed, a plasma process can be used for the purpose, such as the one offered commercially by Hughes Danbury Optical Systems Inc., Danbury (Conn.), USA, for the thinning of objects in wafer form.

The semiconductor material was a commercially available wafer of monocrystalline high-purity silicon (crystal orientation <100>) doped with boron, whose diameter was 150 mm and its thickness 675 $\mu$m. The wafer had rounded edges. Its flatness was $\leq$30 $\mu$m, and its total thickness variation was $\leq$6 $\mu$m.

The quartz glass substrate consisted of transparent, synthetic quartz glass whose viscosity at a temperature of 950° C. was $10^{14.5}$ poise. The OH content of the quartz glass was under 1 ppm. The quartz glass disk-shaped substrate had a diameter of 152 mm. Its thickness was 800 μm, it had rounded edges, it had a flatness of ≦2 μm, and the total thickness variation other substrate was ≦2 μm. The quartz glass substrate was polished both sides, the roughness depth $R_q$ of each polished surface amounting to 0.45 nm. The total content of alkali elements was about ≦0.1 ppm. Before the two wafers were joined together they were cleaned. The silicon wafer was treated by the known RCA method (Handbook of Semiconductor Silicon Technology, Noyes Publications, New Jersey, USA 1990, p. 275 ff). The quartz glass substrate was first cleaned with ethyl alcohol (MOS Selectipur), then subjected to a treatment with a 30% hydrochloric acid (Ultrapur) for a period of 10 minutes, and then rinsed with ultra-pure water (0.1 μS/cm).

After cleaning, the wafers to be joined were placed one upon the other in a clean room, preferably with the quartz glass substrate over the silicon wafer. Light pressure applied on the upper wafer resulted in an intimate bonding of the two wafers. The quality of the bond was tested through the transparent quartz glass with the aid of an interference pattern, and can be easily checked in this manner.

The semiconductor element thus prepared in sandwich form showed mechanical tensions of less than 1000 N/cm². An electron mobility in the monocrystalline silicon wafer of more than 100 cm²/V/s was measured at room temperature.

The the thickness of the silicon wafer joined to the quartz glass substrate was then reduced by mechanical subtraction from its initial thickness of 675 μm to a thickness of 2000 nm.

Examples of semiconductor elements according to the invention are represented in

BRIEF DESCRIPTION OF THE DRAWING

FIGS. 1 to 3, wherein:

FIG. 1 is a perspective view of a semiconductor element of the invention.

FIG. 2 is a vertical section through a semiconductor element of the invention.

FIG. 3 is a vertical section through a semiconductor element of the invention.

DETAILED DESCRIPTION OF THE PREFERRED EMBODIMENTS

Figure 1:
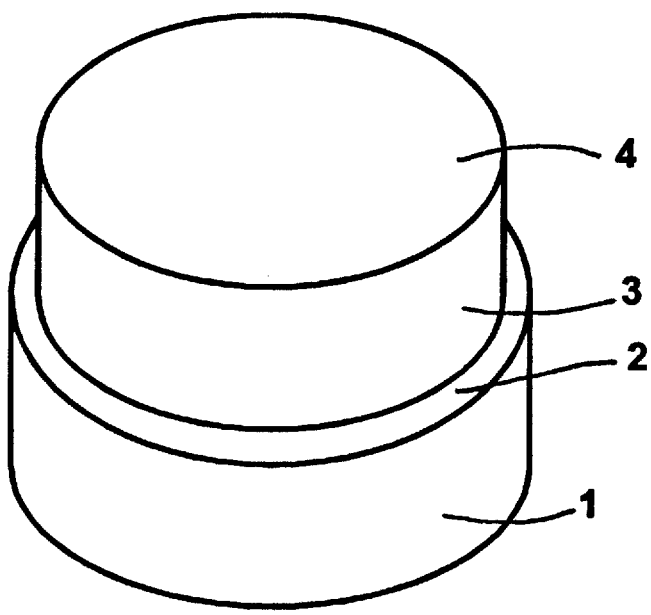

The semiproduct of FIG. 1 consists of a transparent quartz glass substrate 1 in wafer form, whose polished surface is directly joined fully face-to-face to a silicon wafer 4. The dimensions of the quartz glass substrate and of the silicon wafer, as well as their flatness and total thickness variation, are as given in the example above. The viscosity of the quartz glass substrate was $10^{14.5}$ poise at 950° C., its OH content was less than 1 ppm, and its total content of alkali elements was ≦0.1 ppm.

Figure 2:
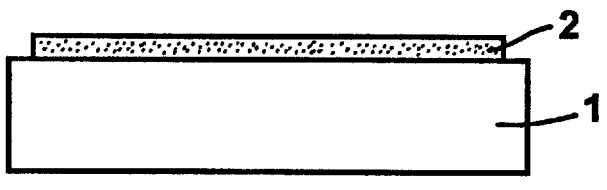

FIG. 2 shows a semiconductor element with a quartz glass substrate 1 and a silicon wafer 2. In this semiconductor element the original thickness of the silicon wafer 2, after preparation of the sandwich is reduced by mechanical ablation to a thickness of 2000 nm. Then the silicon wafer with its thickness reduced is doped with arsenic through its entire thickness, as is well known in semiconductor technology, as indicated by the dots.

Figure 3:
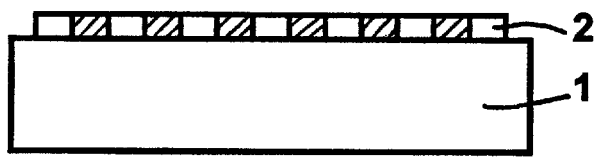

The semiconductor element of quartz glass substrate 1 and silicon wafer 2 represented in FIG. 3 differs from the one represented in FIG. 2 in that, in a silicon wafer whose thickness is reduced to no more than 1000 nm, discrete surface areas not adjoining one another are doped with arsenic through their entire depth, as indicated by the hatching, as is well known in semiconductor technology.

We claim:

1. A semiconductor element for an electronic or opto-electronic semiconductor component, said semiconductor element comprising a sandwich which consists of a disk-shaped, transparent quartz glass substrate and a wafer of a monocrystalline semiconductor material, the quartz glass substrate and the wafer having surfaces joined together face-to-face, said surfaces being polished before being joined together, the quartz glass of the substrate being a synthetic quartz glass which has a viscosity of at least $10^{14.0}$ poise at 950° C. and not less than $10^{12}$ poise at a temperature of 1050° C., the quartz glass having an alkali element content of no more than 1 ppm, the quartz glass containing a total of no more than 1 ppm of metallic impurities of the elements iron, nickel, copper, chromium and/or the transition metals, and the polished surface of the quartz glass substrate having a roughness depth $R_q$ of no more than 2 nm.

2. A semiconductor element according to claim 1, wherein at least one of the polished surfaces has a roughness depth $R_q$ of less than 1 nm.

3. A semiconductor element according to claim 1 wherein the roughness depth $R_q$ of the polished surface of the quartz glass substrate is no greater than 0.5 nm.

4. A semiconductor element according to claim 1, wherein the quartz glass has a content totaling no more than 1 ppm of the elements phosphorus, arsenic, antimony, bismuth, boron, gallium, indium and/or titanium.

5. A semiconductor element according to claim 1 wherein the OH content of the quartz glass is no more than 1 ppm.

6. A semiconductor element according to claim 1 wherein the quartz glass substrate has a thickness of ≦10 mm.

7. A semiconductor element according to claim 6 wherein the thickness of the quartz glass substrate is less than 2 mm.

8. A semiconductor element according to claim 1 wherein the semiconductor material consists of monocrystalline silicon.

9. A semiconductor product in sandwich form for an electronic or opto-electronic semiconductor component, said semiconductor product comprising a sandwich which consists of a disk-shaped, transparent quartz glass substrate and a wafer of a semiconductor material, the quartz glass substrate and the wafer having surfaces joined together face-to-face, said surfaces being polished before being joined together, the quartz glass of the substrate being a synthetic quartz glass which has a viscosity of at least $10^{14.0}$ poise at 950° C. and which does not fall below a value of $10^{12}$ poise at a temperature of 1050° C., the alkali element content in the quartz glass totaling no more than 1 ppm, the quartz glass containing a total of no more than 1 ppm of metallic impurities of the elements iron, nickel, copper, chromium and/or the transition metals, and at least one of the polished surfaces having a roughness depth $R_q$ of no more than 2 nm; and wherein the semiconductor material consists of monocrystalline gallium arsenide, gallium phosphide, gallium aluminum arsenide or gallium nitride.

10. A semiconductor element according to claim 8 wherein the semiconductor material is doped.

11. A semiconductor element according to claim 1 wherein the wafer of semiconductor material is reduced by ablation.

12. A semiconductor element according to claim 11 wherein the wafer of semiconductor material is reduced by ablation to a thickness of no more than 5000 nm.

13. A semiconductor element according to claim 12 wherein at a thickness of no more than 5000 nm the wafer of semiconductor material is doped through its entire thickness.

14. A semiconductor element according to claim 12 wherein at a thickness of no more than 1000 nm, discrete, non-adjacent areas of the wafer of semiconductor material are doped over the entire thickness of the semiconductor wafer.

15. A semiconductor element according to claim 12 wherein the sandwich has a silicon content of at least 99.2%.

* * * * *

UNITED STATES PATENT AND TRADEMARK OFFICE
CERTIFICATE OF CORRECTION

PATENT NO. : 5,831,309
DATED : Nov. 3, 1998
INVENTOR(S) : Englisch, et al.

It is certified that error appears in the above-identified patent and that said Letters Patent is hereby corrected as shown below:

In column 1, line 44, change "adhesion" to -- adhesion, --.

In column 2, line 62, insert -- Example --.

In column 3, line 61, change "sandwich" to -- sandwich,--.

Signed and Sealed this

Eighth Day of August, 2000

Attest:

Q. TODD DICKINSON

Attesting Officer

Director of Patents and Trademarks